IMAGE

United States Patent
Nakamura et al.

(10) Patent No.: US 6,407,921 B1
(45) Date of Patent: Jun. 18, 2002

(54) COOLING UNIT FOR COOLING A HEAT-GENERATING COMPONENT IN AN ELECTRONIC APPARATUS

(75) Inventors: Hiroshi Nakamura; Chihei Kitahara, both of Ome; Kentaro Tomioka, Sayama; Katsuhiko Yamamoto, Nagaoka, all of (JP)

(73) Assignees: Kabushiki Kaisha Toshiba, Kawasaki; Toshiba Home Technology Corporation, Kamo, both of (JP)

( * ) Notice: Subject to any disclaimer, the term of this patent is extended or adjusted under 35 U.S.C. 154(b) by 0 days.

(21) Appl. No.: 09/487,480

(22) Filed: Jan. 19, 2000

(30) Foreign Application Priority Data

Jan. 22, 1999 (JP) .......................... 11-014570

(51) Int. Cl.$^7$ ............................... H05K 7/20
(52) U.S. Cl. .................. 361/700; 165/104.33; 361/698
(58) Field of Search .................. 454/184; 165/80.3, 165/80.4, 185, 104.33; 174/15.2; 361/687, 695, 694, 697, 699, 700, 704, 717–719, 698

(56) References Cited

U.S. PATENT DOCUMENTS

| 5,323,847 A | * | 6/1994 | Koizumi et al. ....... 165/104.33 |
| 5,339,214 A | | 8/1994 | Nelson ..................... 361/695 |
| 5,581,443 A | * | 12/1996 | Nakamura |
| 5,712,762 A | * | 1/1998 | Webb |
| 5,781,409 A | * | 7/1998 | Mecredy, III |
| 5,784,256 A | * | 7/1998 | Nakamure |
| 5,917,697 A | * | 6/1999 | Wang ..................... 361/695 |
| 5,959,837 A | * | 9/1999 | Yu ......................... 361/697 |
| 6,043,977 A | * | 3/2000 | Nakajima |
| 6,049,455 A | * | 4/2000 | Nakamura |
| 6,094,347 A | * | 7/2000 | Bhatia |
| 6,111,748 A | * | 8/2000 | Bhatia |
| 6,125,035 A | * | 9/2000 | Hood, III |
| 6,141,215 A | * | 10/2000 | Podwalny |

FOREIGN PATENT DOCUMENTS

| JP | 5-102687 | 4/1993 |
| JP | 9-233406 | 9/1997 |
| JP | 10-51170 | 2/1998 |
| JP | 10-111735 | 4/1998 |
| JP | 10-126080 | 5/1998 |
| JP | 10-247712 | 9/1998 |

* cited by examiner

Primary Examiner—Gerald Tolin
(74) Attorney, Agent, or Firm—Finnegan, Henderson, Farabow, Garrett, & Dunner, L.L.P.

(57) ABSTRACT

A cooling unit having a heat-receiving portion and a heat-exchanging portion. The heat-receiving portion is thermally connected to a heat-generating component. The heat-exchanging portion receives heat from the heat-receiving portion, at a position different from the position where the heat-generating component is provided. A part of the heat generated by the heat-generating component and transmitted to the heat-receiving portion is transferred to the heat-exchanging portion through a heat pipe. A fan device is provided between the heat-receiving portion and the heat-exchanging portion. The fan device supplies cooling air from the heat-receiving portion to the heat-exchanging portion

23 Claims, 7 Drawing Sheets

COOLING UNIT FOR COOLING A HEAT-GENERATING COMPONENT IN AN ELECTRONIC APPARATUS

BACKGROUND OF THE INVENTION

The present invention relates to a cooling unit for facilitating the radiation of heat from heat-generating components such as semiconductor packages, and also an electronic apparatus incorporating the cooling unit.

In recent years, portable electronic apparatuses, typified by book-like portable computers and portable information tools, have been provided. Each of these apparatuses incorporates an MPU (Micro Processing Unit) designed to process multimedia information, such as characters, speech, sound, and images. The data-processing speed and the number of functions of the MPU have continuously increased. The higher the speed the MPU processes data and the more functions it performs, the more electric power it consumes. The amount of heat the MPU generates while operating increases in proportion to the power it consumes. In the case of a portable computer incorporating an MPU, the heat generated by the MPU must be radiated efficiently from the MPU in the housing of the portable computer. It is therefore absolutely necessary to provide a cooling unit in the computer housing to cool the MPU.

Jpn. Pat. Appln. KOKAI Publication No. 10-51170 discloses a conventional cooling unit. The cooling unit comprises a heat sink, a heat-conducting duct, a heat pipe and a fan. The heat sink has a heat-receiving portion and a heat-radiating portion. The heat-receiving portion is thermally connected to an MPU. The heat-radiating portion receives heat from the heat-receiving portion. The heat-radiating portion is remote from the heat-receiving portion. The heat-conducting duct is secured to the heat-radiating portion of the heat sink. The heat-conducting duct has an inlet port and an exhaust port. Air is supplied into the duct through the inlet port and exhausted from the duct through the exhaust port. Both the inlet port and the exhaust port open to the outside the housing of a computer.

The heat pipe is arranged, extending along the heat sink. The heat pipe thermally connects the heat-receiving portion and the heat-radiating portion. Hence, the heat generated by the MPU is effectively transferred from the heat-receiving portion to the heat-radiating portion through the heat pipe.

The fan is provided in the heat-conducting duct. When the fan is driven, air is drawn into the duct through the inlet port of the duct. In the duct the air flows to the exhaust port, cooling the heat-radiating portion of the heat sink. The heat of the MPU, transmitted to the heat-radiating portion, is thereby radiated from the housing in the form of heated air.

In the conventional cooling unit, the heat transmitted from the MPU to the heat-receiving portion is transferred to the heat-radiating portion by virtue of heat conduction to the heat-radiating portion and by way of the heat pipe and is radiated from the heat-radiating portion.

The housings of portable computers developed recently are made thin and compact. The heat sink of the cooling unit provided in the housing needs to be small, too. Therefore, the heat sink cannot have a sufficient thermal capacity. The resistance to the heat propagating in the heat sink inevitably increases. Consequently, it cannot be expected that the heat conducted through the heat sink be radiated with high efficiency.

In the conventional cooling unit, the transfer of heat from the heat-receiving portion to the heat-radiating portion cannot help but largely depend on the heat pipe. It is difficult to transmit the heat of the MPU to the heat-radiating portion with high efficiency. The cooling unit should therefore be improved further in terms of the efficiency of radiating heat from the MPU.

The portable computers hitherto developed have heat-generating circuit components each, such as a power-supply circuit unit and a memory. These circuit components are provided in the housing of the computer, together with the MPU. There is the trends that the amount of heat that the circuit components generate while operating gradually increases. The amount of the heat these components radiate is therefore too large to neglect, and is one of the causes of raising the temperature in the housing.

The conventional cooling units are all designed to cool the MPU only. The circuit components other than the MPU are located outside the route of the heat-conducting path, provided in the cooling unit. The temperature in the housing inevitably rises, due to the heat generated by these circuit components. This increases the ambient temperature of the MPU, adversely influencing the operation of the MPU.

BRIEF SUMMARY OF THE INVENTION

The first object of the present invention is to provide a compact cooling unit that can efficiently cool a heat-generating component.

The second object of the invention is to provide a compact cooling unit that can efficiently cool a plurality of heat-generating components, without requiring a large installation space.

The third object of the invention is to provide an electronic apparatus in which a heat-generating component can be cooled efficiently and the housing of which can be made small with ease.

To attain the first and second objects, a cooling unit according to the first aspect of the invention comprises a heat-receiving portion and a heat-exchanging portion. The heat-receiving portion receives the heat generated by a heat-generating component. The heat-exchanging portion receives heat from the heat-receiving portion. A part of the heat the heat-generating component generates is transferred to the heat-exchanging portion through heat-transferring means. An air-supply means is located between the heat-receiving portion and the heat-exchanging portion, for supplying cooling air from the heat-receiving portion to the heat-exchanging portion.

To achieve the third object of the invention, an electronic apparatus according to the second aspect of the invention comprises a heat-receiving portion, a housing, and a heat-exchanging portion provided in the housing. The heat-receiving portion receives the heat generated by a heat-generating component. The heat-exchanging portion receives heat from the heat-receiving portion. A part of the heat the heat-generating component generates is transferred to the heat-exchanging portion through heat-transferring means. An air-supply means is located between the heat-receiving portion and the heat-exchanging portion, for supplying cooling air in the housing from the heat-receiving portion to the heat-exchanging portion.

In both the cooling unit and the electronic apparatus, the heat generated by the heat-generating component is diffused as it is conducted from the heat-receiving portion to the heat-exchanging portion. A part of the heat transmitted from the heat-generating component to the heat-receiving portion is transferred to the heat-exchanging portion via the heat-transferring means.

Since the heat-exchanging portion receives the cooling air supplied by air-supply means, the heat of the heat-generating component is radiated into the atmosphere as the cooling air flows into the atmosphere. When the air-supply means supplies cooling air from heat-receiving portion to the heat-exchanging portion, the cooling air flows along the heat-receiving portion. The heat-receiving portion is therefore cooled by virtue of not only the transfer of heat accomplished by the heat-transferring means, but also the forced convection of the cooling air.

Both the air-cooling of the heat-receiving portion and the heat transfer from the heat-receiving portion to the heat-exchanging portion are utilized in order to radiate the heat from the heat-receiving portion with high efficiency. This makes it possible to reduce the thermal capacity in the heat-conducting path that extends from the heat-receiving portion to the heat-exchanging portion. The heat-receiving portion and the heat-exchanging portion can be made compact. Moreover, the housing need not have a large space to accommodate the cooling unit. It is therefore easy to render the housing thin and small.

To attain the first and second objects, a cooling unit according to the third aspect of the invention comprises a heat-receiving portion and a heat-exchanging portion. The heat-receiving portion receives the heat generated by a heat-generating component. The heat-exchanging portion receives heat from the heat-receiving portion. A part of the heat the heat-generating component generates is transferred to the heat-exchanging portion through heat-transferring means. An air-supply means is located between the heat-receiving portion and the heat-exchanging portion. The air-supply means has a first air-supplying port and a second air-supplying port. The first air-supplying port is provided to supply cooling air to the heat-exchanging portion. The second air supplying-port is provided to supply cooling air to the heat-receiving portion.

In the cooling unit thus constructed, the heat generated by the heat-generating component is diffused as it is conducted from the heat-receiving portion to the heat-exchanging portion. A part of the heat transmitted from the heat-generating component to the heat-receiving portion is transferred to the heat-exchanging portion via the heat-transferring means.

Since the heat-exchanging portion receives the cooling air supplied through the first air-supplying port, it is cooled by virtue of forced convection of the cooling air. Hence, the heat of the heat-generating component transferred to the heat-exchanging portion is radiated into the atmosphere as the cooling air flows into the atmosphere. Since the air-supply means supplies cooling air to the heat-receiving portion through the second air-supplying port, the heat-receiving portion is cooled by virtue of the forced convection of the cooling air, too. As a result, the efficiency of radiating heat from the heat-receiving portion can increase, due to not only the heat transfer achieved by the heat-transferring means but also the forced convection of cooling air.

Both the air-cooling of the heat-receiving portion and the heat transfer from the heat-receiving portion to the heat-exchanging portion are utilized in order to radiate the heat from the heat-receiving portion with high efficiency. This makes it possible to reduce the thermal capacity in the heat-conducting path that extends from the heat-receiving portion to the heat-exchanging portion. The cooling unit can therefore be made compact, thus requiring no large installation space.

To attain the first and second objects, a cooling unit according to the fourth aspect of the invention has two heat-receiving portions and one heat-exchanging portion. The heat-exchanging portion receives the heat generated by a first heat-generating component and transmitted to the first heat-receiving portion. It also receives the heat generated by a second heat-generating component and transmitted to the second heat-receiving portion. The first heat-receiving portion is thermally connected to the heat-exchanging portion by first heat-transferring means. Similarly, the second heat-receiving portion is thermally connected to the heat-exchanging portion by second heat-transferring means. The heat-exchanging portion receives cooling air supplied by air-supply means.

To achieve the third object of the invention, an electronic apparatus according to the fifth aspect of the invention comprises a housing and a heat-exchanging portion provided in the housing. The heat-exchanging portion receives the heat generated by a first heat-generating component and transmitted to a first heat-receiving portion. The heat-exchanging portion receives also the heat generated by a second heat-generating component and transmitted to a second heat-receiving portion. The first heat-receiving portion is thermally connected to the heat-exchanging portion by first heat-transferring means. Similarly, the second heat-receiving portion is thermally connected to the heat-exchanging portion by second heat-transferring means. The heat-exchanging portion receives cooling air supplied by air-supply means.

In both the cooling unit and the electronic apparatus, the heat transmitted from the first heat-generating component to the first heat-receiving portion is transferred to the heat-exchanging portion via the first heat-transferring means. Similarly, the heat transmitted from the second heat-generating component to the second heat-receiving portion is transferred to the heat-exchanging portion via the second heat-transferring means.

Since the heat-exchanging portion receives the cooling air supplied through the air-supply means, it is cooled by virtue of forced convection of the cooling air. The heat of the first and second heat-generating components, transferred to the heat-exchanging portion, is therefore radiated from the housing as the cooling air flows from the housing. Thus, the two heat-generating components can be cooled uniformly by means of one heat-exchanging portion. This can maintain the ambient temperatures of both heat-generating components at appropriate values.

In the electronic apparatus, the heat generated by the first heat-generating component and the heat generated by the second heat-generating component are collected at one position. Hence, two air-supply means need not be provided for the two heat-generating components, respectively. Nor is it necessary to use a large heat-receiving portion that extends over both heat-generating components. The cooling unit for use in the electronic apparatus can therefore be made compact. It follows that the housing of the electronic apparatus need not have a large space to accommodate the cooling unit. This renders it easy to make the housing thin and small.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A portable computer, which is the first embodiment of this invention, will be described, with reference to FIGS. 1 to 7.

Figure 1:
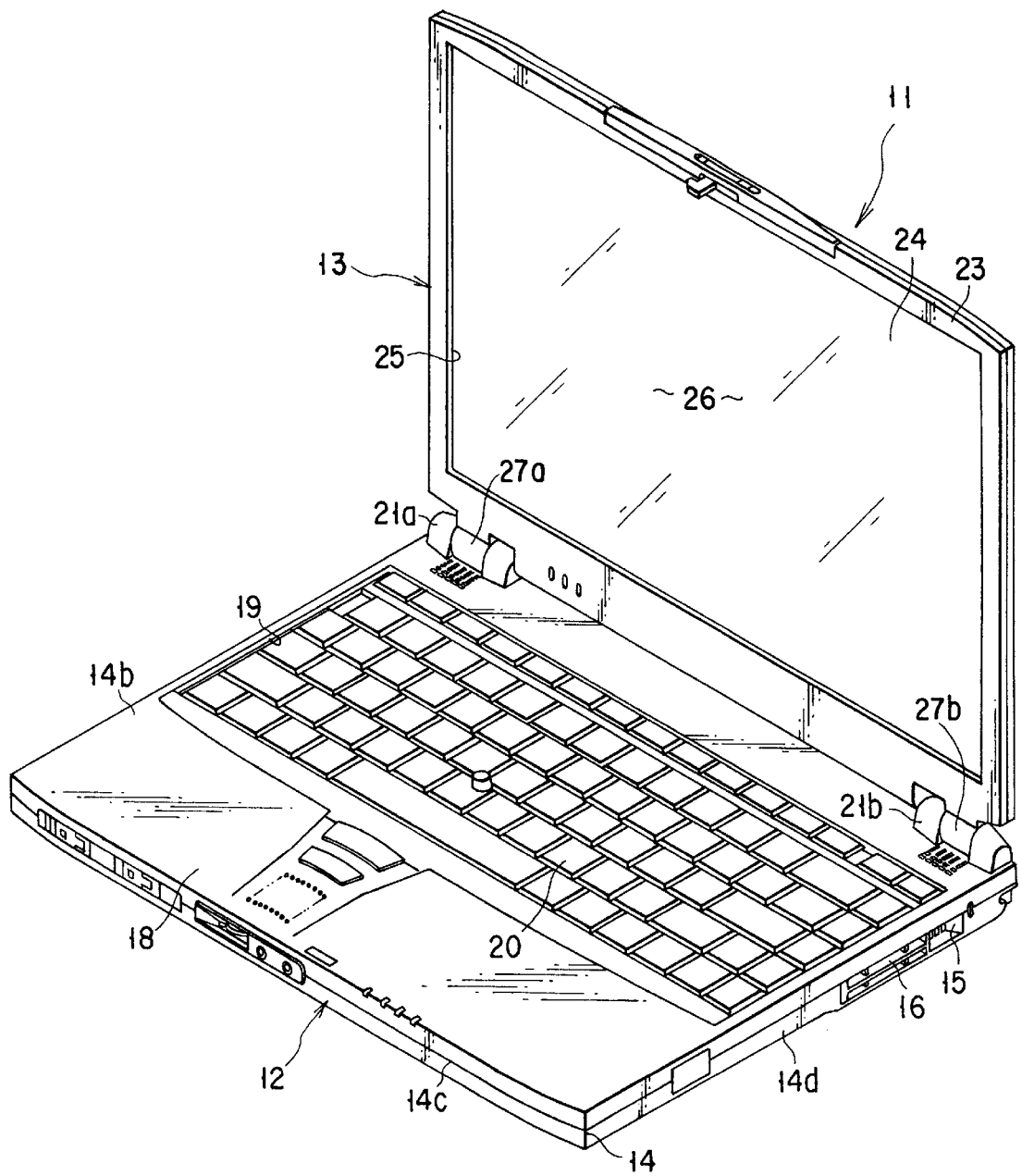
FIG. 1 is a perspective view of a portable computer which is the first embodiment of the present invention.

FIG. 1 shows the portable computer 11. The portable computer 11 comprises a main body 12 and a display unit 13 supported by the main body 12.

The man body 12 has a housing 14 which is shaped like a flat box. The housing 14 is made of metal having high thermal conductivity, such as magnesium alloy. The housing 14 comprises a bottom wall 14a, a top wall 14b, a front wall 14c, left and right side walls 14d, and a rear wall (not shown). The right side wall 14d has an exhaust port 15 near the rear end. A grating 16 is fitted in the exhaust port 15, preventing things like paper clips from entering the housing 14.

The top wall 14b of the housing 4 has a palm rest 18 and a keyboard recess 19. The palm rest 18 is rectangular, extending in the widthwise direction of the housing 14. The keyboard recess 19 is located at the back of the palm rest 18. The recess 19 holds a keyboard 20. The top wall 14b has a pair of display supports 21a and 21b. The supports 21a and 21b extend upwards at the rear end of the top wall 14b and are spaced apart from each other in the widthwise direction of the housing 14.

The display unit 13 comprises a display housing 23 and a liquid-crystal display module 24. The display housing 23 is a flat box and has a front wall, which has a rectangular opening 25. The display module 23 is set in the display housing 23 and has a screen 26 for displaying characters and images. The screen 26 is exposed through the rectangular opening 25 of the display housing 23.

The display housing 23 has a pair of legs 27a and 27b. The legs 27a and 27b protrude downwards from the lower edge of the housing 23. The legs 27a and 27b are hinged to the display supports 21a and 21b, respectively, by means of hinge devices (not shown). The display unit 13 is thereby connected to the housing 14 and can be rotated. More specifically, the unit 13 can be rotated between a closed position and an opened position. In the closed position, the display unit 13 covers the palm rest 18 and keyboard 20. In the opened position, the display unit 13 opens the palm rest 18 and keyboard 20.

Figure 2:
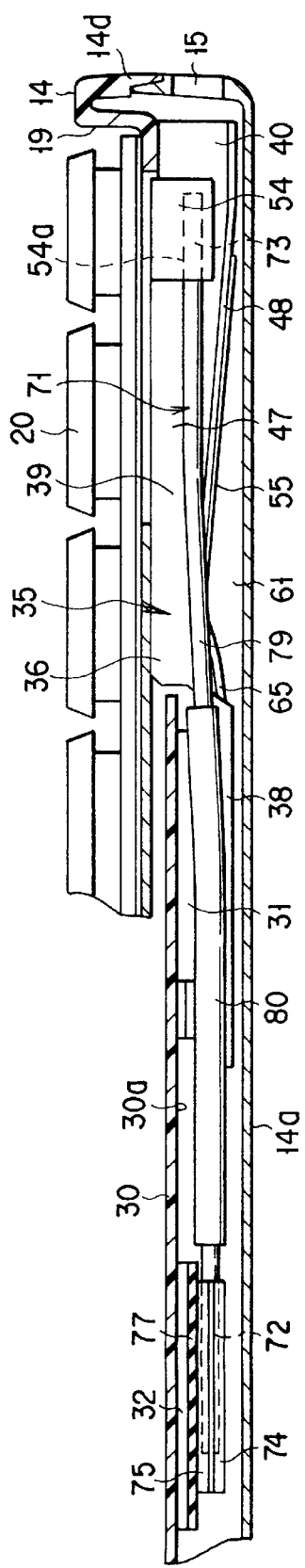
FIG. 2 is a sectional view showing the housing of the portable computer and the cooling unit provided in the housing.
Figure 3:
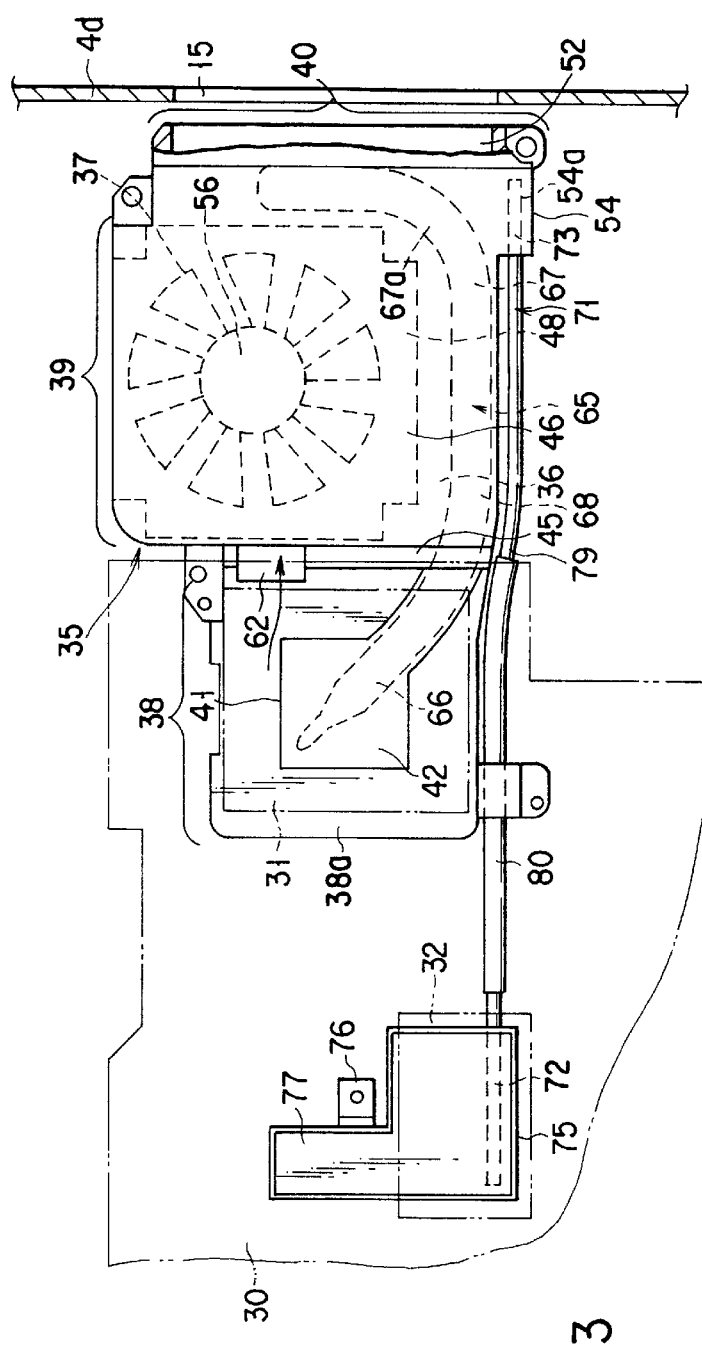
FIG. 3 is a plan view illustrating the positional relation between the cooling unit and the MPU mounted on the circuit board incorporated in the portable computer.
Figure 4:
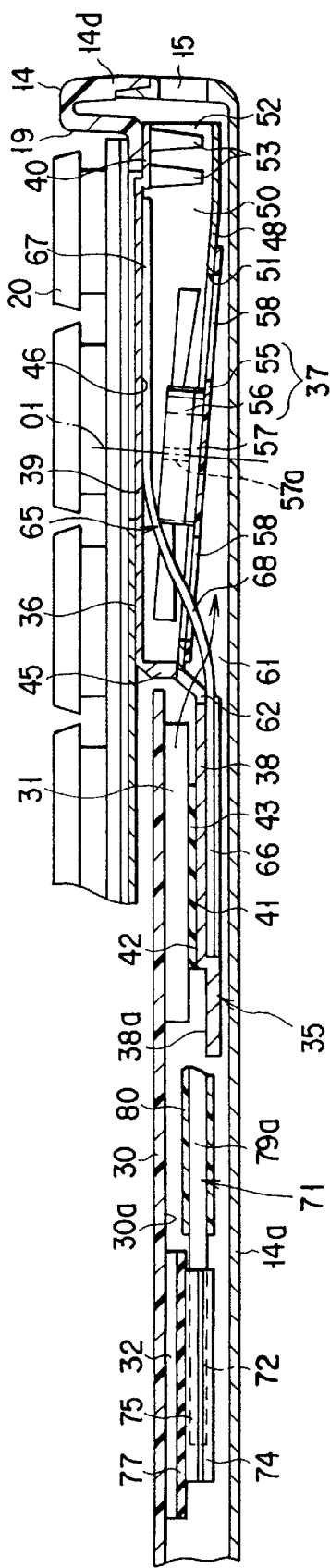
FIG. 4 is a sectional view of the portable computer, showing the positional relation between the cooling unit and the MPU mounted on the circuit board.

As shown in FIGS. 2 to 4, the housing 14 contains a circuit board 30. The circuit board 30 is located below the keyboard 20 and extends parallel to the bottom wall 14a of the housing 14. The circuit board 30 has a lower surface 30a, which opposes the bottom wall 14a. On the lower surface 30a of the circuit board 30 there are mounted two heat-generating components 31 and 32, which generate heat while operating.

The first heat-generating component 31 is an MPU (Micro Processing Unit), or an BGA-type semiconductor package. The first heat-generating component 31 consumes much power, while operating to process useful multimedia information (e.g., characters, speech, sound and images) at high speed. While operating, the component 31 generates so much heat that it needs to be cooled. The first heat-generating component 31 is positioned at the right end of the circuit board 30.

The second heat-generating component 32 is, for example, a memory or an electronic part of a power-supply unit. The amount of heat the component 32 generates increases as the functions the first-heat generating component 31 performs increases in numbers and may be too large to neglect. The second heat-generating component 32 is positioned at the right end of the circuit board 30, too.

The housing 14 contains a cooling unit 35 for facilitating the heat radiation from both heat-generating components 31 and 32. The cooling unit 35 comprises a heat sink 36 and an electric fan device 37. The electric fan device 37 is integral with the heat sink 36.

Figure 6:
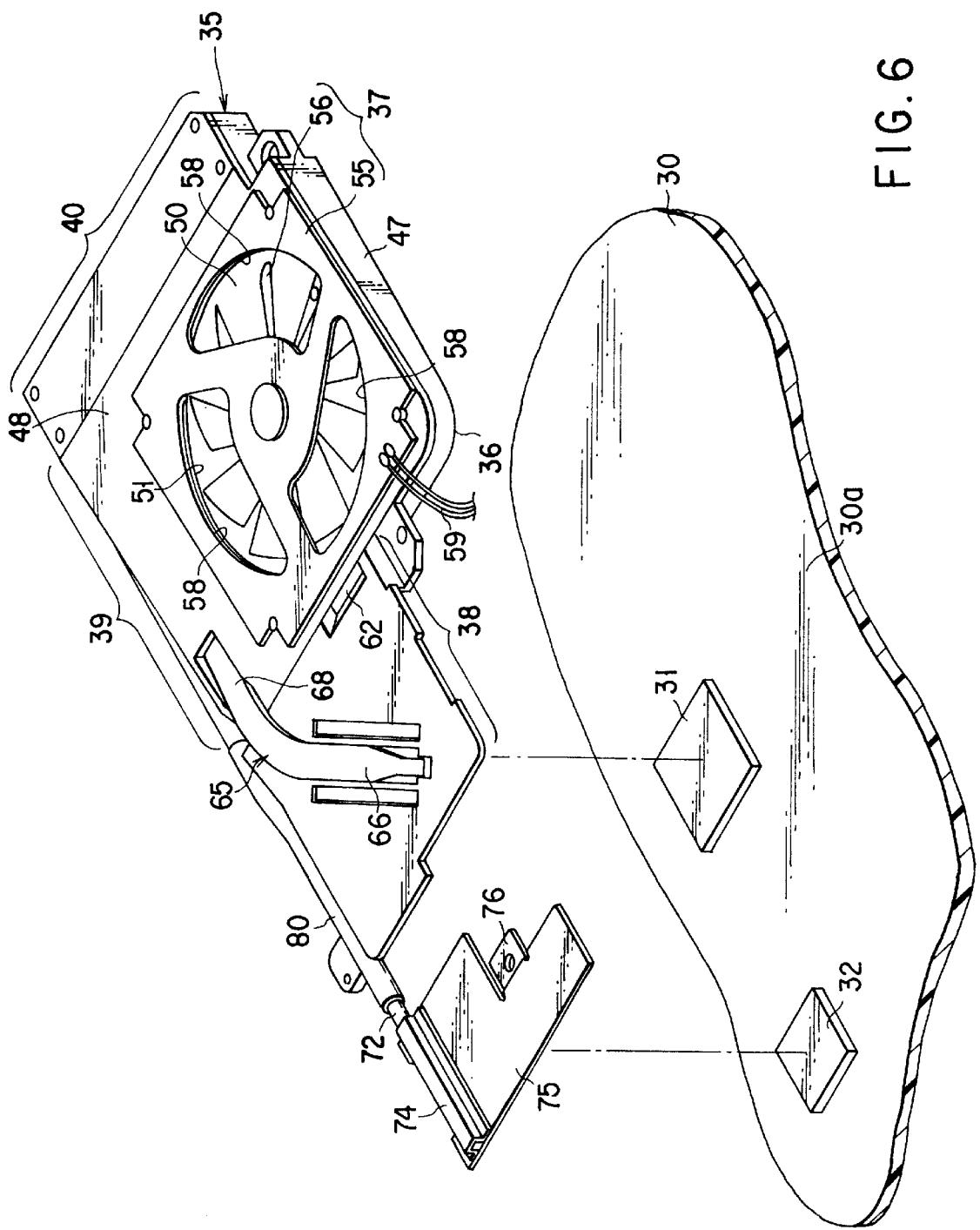
FIG. 6 is an exploded view illustrating the positional relation between the cooling unit and the MPU mounted on the circuit board.
Figure 7:
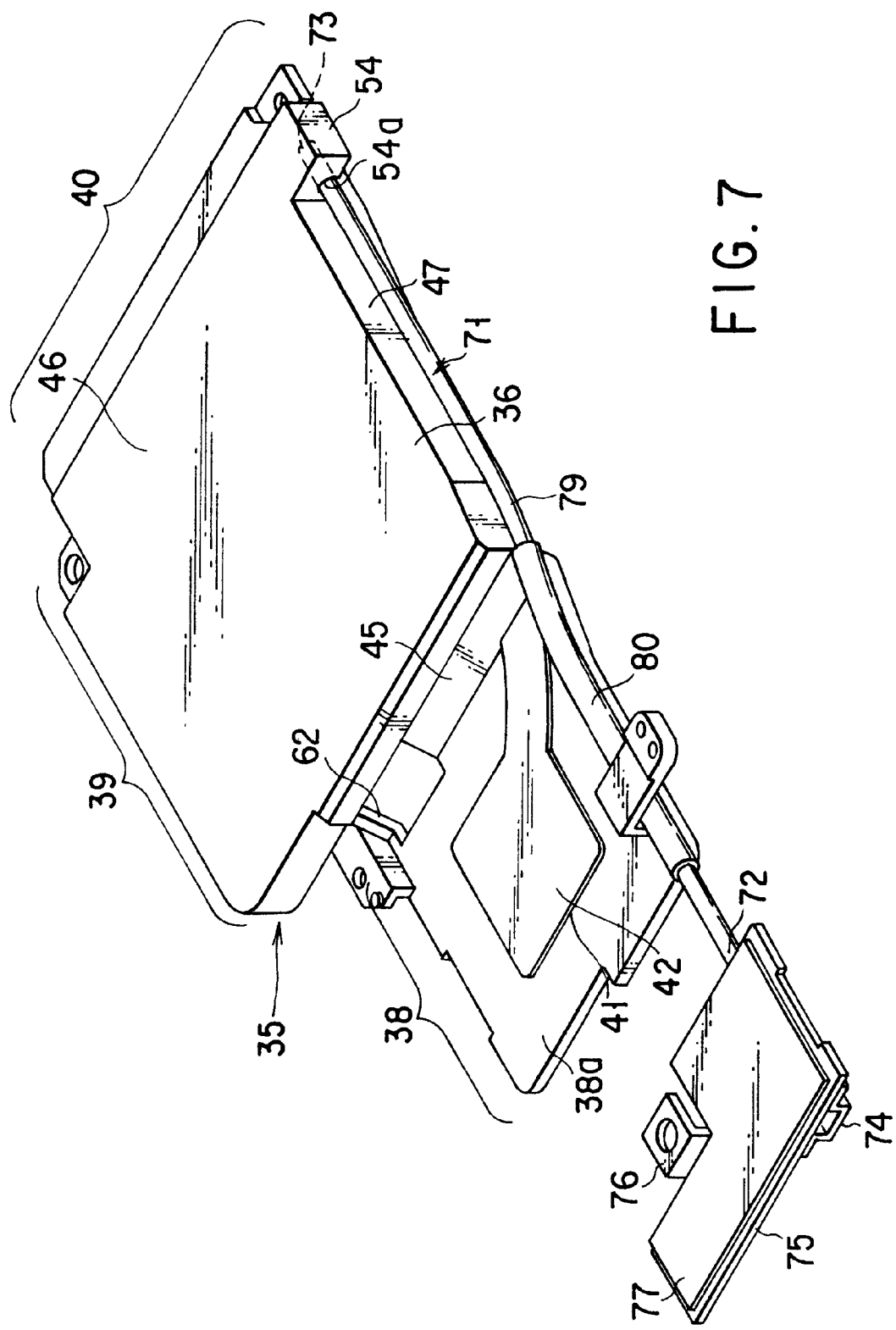
FIG. 7 is a perspective view of the cooling unit.

The heat sink 36 is made of metal having high thermal conductivity, such as aluminum alloy. It is supported, extending from the bottom wall 14a of the housing 14 to the circuit board 30. As shown in FIGS. 6 and 7, the heat sink 36 comprises a heat-receiving portion 38, a fan-supporting portion 39, and a heat-exchanging portion 40. The portions 38, 39 and 40 are integral with one another and are arranged in a row in the widthwise direction of the housing 14.

The heat-receiving portion 38 is a flat plate and secured between the bottom wall 14a and the right end portion of the circuit board 30. The portion 38 has an upper surface 38a that opposes the first heat-generating component 31. The portion 38 has a seat 41 on the upper surface 38a, at the center thereof. The seat 41 protrudes a little from the upper surface 38a. The upper surface of the seat 41 is flat, serving as a flat heat-receiving surface 42. The heat-receiving surface 42 is thermally connected to the first heat-generating component 31 by a heat-transmitting material 43.

The heat-transmitting material 43 is a sheet or grease which have high thermal conductivity.

The fan-supporting portion 39 is coupled to the right end of the heat-receiving portion 38 by a coupling wall 45. The coupling wall 45 extends upwards from the right end of the heat-receiving portion 38. The top end of the wall 45 protrudes upwards from the circuit board 30. The fan-supporting portion 39 is located between the circuit board 30 and the right side wall 14d of the housing 14. The portion 39 has a flat ceiling 46, which is connected to the upper end of the coupling wall 45 and which extends parallel to the bottom wall 14a of the housing 14. The ceiling 46 is located above the heat-receiving portion 38, by a distance H for which the top end of the wall 45 protrudes upwards from the heat-receiving portion 38. Walls 47 are provided, extending downwards from the edges of the ceiling 46. A support plate 48 is secured to the lower edges of the walls 47. The support plate 48 opposes the bottom wall 14a and is inclined upwards, increasingly spaced away from the bottom wall 14a as it extends toward the heat-receiving portion 38. The support plate 48 cooperates with the ceiling 46 and walls 47, defining an air passage 50. The support plate 48 has a circular opening 51, which communicates with the air passage 50.

The heat-exchanging portion 40 opposes the heat-receiving portion 38, with the fan-supporting portion 39 located between the portions 38 and 40. The heat-exchanging portion 40 has an outlet port 52 that communicates with the downstream end of the air passage 50. The outlet port 52 opposes the exhaust port 15 of the housing 14. The heat-exchanging portion 40 has a number of heat-radiating fins 53 and a pipe-coupling section 54. The fins 53 are located in the air passage 50. The pipe-coupling section 54 is integral with the walls 47 and protrudes outwards from a side of the heat-exchanging portion 40. The pipe-coupling section 54 has a pipe-holding hole 54a that opens to the heat-receiving portion 38.

Figure 5:
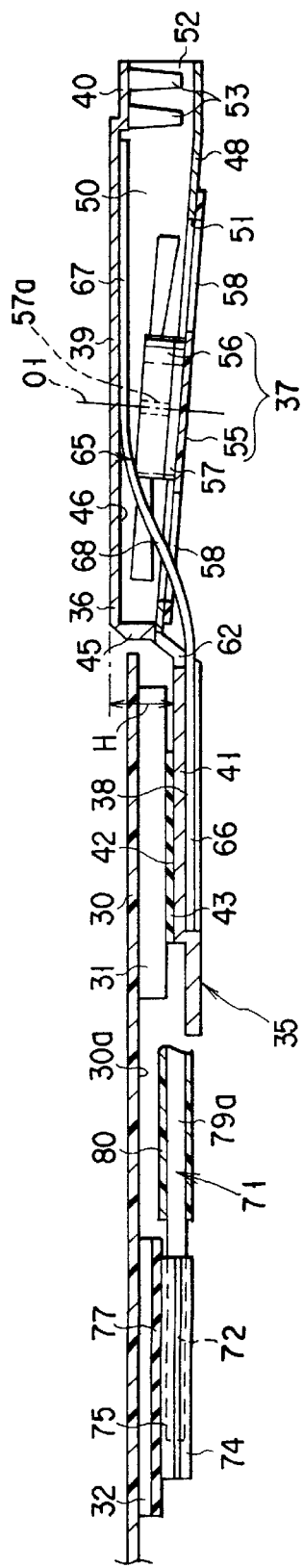
FIG. 5 is a sectional view representing the positional relation between the cooling unit and the MPU mounted on the circuit board.

As shown in FIGS. 4 to 6, the fan device 37 is secured to the fan-supporting portion 39 and located between the heat-receiving portion 38 and the heat-exchanging portion 40. The fan device 37 comprises a control board 55 and a rotor 56. The control board 55 is secured to the lower surface of the support plate 48, overlapping the support plate 48 and covering the opening 51 of the support plate 48 from below. A flat motor 57 is mounted on the upper surface of the control board 55, which is exposed to the air passage 50. The rotor 56 is mounted on the shaft 57a of the flat motor 57. The rotor 56 is positioned at the upstream of the air passage 50. The outer circumferential portion of the rotor 56 opposes the outlet port 52.

The fan-supporting portion 39 supports the fan device 37 in horizontal position, with the axis O1 of the rotor 56 extending at right angles to the support plate 48. Since the support plate 48 is inclined up toward the heat-receiving portion 38, the fan device 37 is also slightly inclined in the housing 14, with the rotor axis O1 inclined a little to the vertical line. Thus, the rotor 56 is inclined upwards, from the heat-exchanging portion 40 toward the heat-receiving portion 38.

The control board 55 has three inlet ports 58. The inlet ports 58 are arranged in a circle around the flat motor 57 and spaced apart in the rotation direction of the rotor 56. The control board 55 is electrically connected to the circuit board 30 by lead lines 59. Thus, the circuit board 30 drives the flat motor 57 when the ambient temperature of the first heat-generating component 31 rises above a predetermined value.

A gap 61 is provided between the bottom wall 14a of the housing 14 and the control board 55 of the fan device 37. The gap 61 communicates with the inlet ports 58. The gap 61 gradually increases from the heat-exchanging portion 40 toward the heat-receiving portion 38, because the fan device 37 inclines. The gap 61 is the largest at that part of the coupling wall 45 which lies between the heat-receiving portion 38 and the fan-supporting portion 39. The coupling wall 45 has a ventilation hole 62 that makes the heat-receiving portion 38 and the gap 61 communicate with each other. The heat-receiving portion 38 therefore communicates with the inlet ports 58 of the fan device 37 via the gap 61 and ventilation hole 62.

When the rotor 56 of the fan device 37 is driven, the air in the gap 61 is drawn, as cooling air, into the air passage 50 through the inlet ports 58. The cooling air supplied by the rotor 56 flows in the passage 50 from the heat-receiving portion 38 to the heat-exchanging portion 40. This is because the rotor 56 is gradually inclined up, from the heat-exchanging portion 40 toward the heat-receiving portion 38. The cooling air further flows through the outlet port 52 of the heat-exchanging portion 40 and is exhausted from the housing 14 through the exhaust port 15.

As shown in FIGS. 3 to 5, the cooling unit 35 has a first heat pipe 65, which functions as first heat transfer means. The first heat pipe 65 as two end portions 66 and 67. The first end portion 66 is buried in the lower surface of the heat-receiving portion 38 and, thus, thermally connected to the heat-receiving portion 38. The second end portion 67 extends into the air passage 50. The second end portion 67, extends along the ceiling 46 of the fan-supporting portion 39 and toward the heat-exchanging portion 40 in the direction the cooling air flows in the air passage 50. The second end portion 67 has a curved portion 67a, which extends in the direction in which the rotor 56 rotates. The curved portion 67a has its distal part interposed between the rotor 56 and the outlet port 52. The distal part of the curved portion 67a extends into the middle section of the air passage 50. The second end portion 67, which has the curved portion 67a, contacts the lower surface of the heat-exchanging portion 40 and is thermally connected to the heat-exchanging portion 40.

The second end portion 67 of the first heat pipe 65 protrudes above the first end portion 66, by the distance H for which the top end of the wall 45 protrudes upwards from the heat-receiving portion 38. The first heat pipe 65 has an middle portion 68 between the end portions 66 and 67. The middle portion 68 is gently inclined up, from the first end portion 66 toward the second end portion 67. It is inclined at an acute angle to the end portions 66 and 67. The Due to the curved portion 67a and the middle portion 68, the first heat pipe 65 is bent in three-dimensional fashion.

In the air passage 50, the middle portion 68 of the first heat pipe 65 is positioned beside the fan device 37, at one side of the air passage 50. Thus, the middle portion 68 is spaced far from the middle part of the air passage 50. This side of the air passage 50 deviates from the axis of the rotor 56. Hence, less air flows at this side of the air passage 50 than at the middle part thereof. Consequently, the middle portion 68 of the first heat pipe 65 is not positively cooled with the cooling air, though it is provided in the air passage 50.

The cooling unit 35 has a second heat pipe 71, which functions as second heat transfer means. The second heat pipe 71 extends straight and has two end. portions 72 and 73. The second heat pipe 71 extends along the heat sink 36. The first end portion 72 of the pipe 71 is located between the lower surface 30a of the circuit board 30 and the bottom wall 14a.

A heat-receiving plate 75 is thermally connected by a bracket 74 to the first end portion 72 of the second heat pipe 71. The heat-receiving plate 75 made of metal having high thermal conductivity, such as aluminum alloy. The heat-receiving plate 75 has a support strip 76 that extends upwards. The support strip 76 is secured to the lower surface 30a of the circuit board 30 by means of screws. The plate 75 is thermally connected to the second heat-generating component 32 by a heat-transferring material 77.

The heat-transmitting material 77 is a sheet or grease which have high thermal conductivity.

The second end portion 73 of the second heat pipe 71 is fitted in the pipe-holding hole 54a of the pipe-coupling section 54. The second heat pipe 71 is thereby thermally connected to the heat-exchanging portion 40 of the heat sink 36.

The second heat pipe 71 has a middle portion 79 extending between the end portions 72 and 73. As shown in FIGS. 4 and 5, a part 79a of the middle portion 79 extends along the lower surface 30a of the circuit board 30 and is covered with an electrically insulating protective tube 80. The protective tube 80 prevents short-circuiting between the second heat pipe 71 and the electronic components mounted on the circuit board 30, while the second heat pipe 71 is being laid. This facilitates the process of laying the second heat pipe 71.

In the portable computer 1 thus structured, the heat the first heat-generating component 31 generates while operating is transmitted via the heat-transmitting material 43 to the heat-receiving portion 38 of the heat sink 36. The heat is then transmitted from the heat-receiving portion 38 to the heat-exchanging portion 40 via the coupling wall 45 and the fan-supporting portion 39. The heat therefore diffuse in the entire heat sink 36.

The first heat pipe 65 connects the heat-receiving portion 38 and heat-exchanging portion 40 of the heat sink 36. Part of the heat transmitted from the first heat-generating component 31 to the heat-receiving portion 38 is, therefore, transmitted to the first end portion 66 of the first heat pipe 65. The operating liquid sealed in the first heat pipe 65 is thereby heated, generating vapor. The vapor flows from the first end portion 66 toward the second end portion 67.

The second end portion 67 of the first heat pipe 65 extends to the heat-exchanging portion 40 that is at some distance from the heat-receiving portion 38. The second end portion 67 is therefore held at a lower temperature and a lower inner pressure than the first end portion 66. Heat is therefore released from the vapor guide to the second end portion 67. As a result, the vapor in the second end portion 67 is condensed back into operating liquid. The operating liquid flows from the second end portion 67 to the first end portion 66 by virtue of capillary force. While so flowing, the operation liquid is heated by the heat generated by the first heat-generating component 31. Thus, the operation liquid is repeatedly evaporated and condensed, effectively transferring heat from the heat-receiving portion 38 to the heat-exchanging portion 40.

Of the parts of the first heat pipe 65, the first end portion 66 maintained at low temperature is located at a level lower than the second end portion 67. The operating liquid obtained by condensing the vapor at the second end portion 67 therefore efficiently flows toward the first end portion 66 under the gravity. Hence, the operating liquid circulates well in the heat pipe 65.

The inclined portion 68, which is located between the first end portion 66 and the second end portion 67, is bend gradually up, from the first portion 66 toward the second end portion 67. Therefore, the direction in which the operating liquid flows in the first heat pipe 65 would not abruptly change. This reduces the resistance to the operating liquid. Heat can therefore be fast and efficiently transferred from the first end portion 66 to the second end portion 67. The heat-radiating efficiency of the heat-receiving portion 38 is thereby enhanced.

In addition, the vapor flowing from the first end portion 66 of the first heat pipe 65 to the second end portion 67 thereof is not cooled and not condensed in the middle portion 68 of the first heat pipe 65. The vapor can be reliably guided to the second end portion 67. This is because the middle portion 68 is held at one side of the air passage 50, not at the middle part thereof, and less air flows at this side of the air passage 50 than at the middle part thereof.

When the ambient temperature of the first heat-generating component 31 surpasses the predetermined value, the circuit board 30 drives the flat motor 57, which rotates the rotor 56. The rotor 56 generates a negative pressure in the inlet ports 58 of the fan device 37. Due to the negative pressure, air is drawn, as cooling air, from the housing 14 into the air passage 50. The cooling air flows through the air passage 50 toward the outlet port 52 of the heat-exchanging portion 40. The air cools the fan-supporting portion 39 and the heat-exchanging portion 40 until it is exhausted from the housing 14 through the exhaust port 15. Having a number of heat-radiating fins 53 exposed in the air passage 50, the heat-exchanging portion 40 has a large air-contacting area. The portion 40 can therefore radiate heat with high efficiency.

Since the second end portion 73 of the first heat pipe 65 extends into the middle part of the air passage 50, air is supplied to the second end portion 73 in a sufficient amount. The second end portion 73 is therefore cooled efficiently. This increases the efficiency of cooling the second end portion 73 and, ultimately, the heat-radiating efficiency of the operation liquid. Heat can be transferred fast from the heat-receiving portion 38 to the heat-exchanging portion 40.

In the portable computer 1, the inlet ports 58 of the fan device 37 communicate with the heat-receiving portion 38 via the gap 61 and hole 62. Air is therefore drawn into the inlet ports 58 from a space surrounding the heat-receiving portion 38 and from a space surrounding first heat-generating component 31 through the hole 62 of the coupling wall 45 when the rotor 56 is rotated. As a result, the cooling air flows along the heat-receiving portion 38 and the first heat-generating component 31 as is indicated by the arrows shown in FIGS. 3 and 4. Forced convection of cooling air is thereby generated, whereby the heat-receiving portion 38 and the first heat-generating component 31 are cooled. Furthermore, heat hardly accumulates in the vicinity of the first heat-generating component 31 since the cooling air flows freely in the housing 14.

Therefore, the heat of the first heat-generating component 31 is transferred from the heat-receiving portion 38 of the heat sink 36 to the heat-exchanging portion 40 and then radiated into the atmosphere with high efficiency. This makes it possible to operate the MPU at its maximum capacity at normal operating temperature.

In addition, the heat sink 36 need not have a large thermal capacity, because the heat-radiating efficiency of the heat-receiving portion 38 is enhanced due to the air-cooling of the heat-receiving portion 38 and the forced heat transfer from the heat-receiving portion 38 to the heat-generating portion 40. The heat sink 36 can therefore be made thin and compact.

During the use of the portable computer 1, not only the first heat-generating component 31, but also the second heat-generating component 32 located near the component 31 generates heat. The heat the component 32 has generated is transmitted to the heat-receiving plate 75 through the heat-transferring material 77. The heat is then transferred from the plate 75 to the first end portion 72 of the second heat pipe 71. The operating liquid sealed in the second heat pipe 71 is thereby heated, generating vapor. The vapor flows from the first end portion 72 to the second end portion 73 of the second heat pipe 71.

The second end portion 73 of the second heat pipe 71 is led to the heat-exchanging portion 40 that is remote from the heat-receiving plate 75. The portion 72 remains at a lower temperature and has a lower inner pressure than the first end portion 72. The vapor releases heat in the second end portion 73 and is condensed therein, changing to operation liquid. The operation liquid flows from the second end portion 73 toward the first end portion 72 by virtue of capillary force. While so flowing, the operation liquid is heated by the heat generated by the second heat-generating component 32. Thus, the operation liquid is repeatedly evaporated and condensed, effectively transferring heat from the second heat-generating component 32 to the heat-exchanging portion 40.

The heat transferred to the heat-exchanging portion 40 from the second heat-generating component 32 is released into the housing 14 by virtue of natural convection. The heat transferred to the heat-exchanging portion 40 is released from the portion 40 when the fan device 37 is driven, supplying cooling air through the air passage 50.

Although the second heat-generating component 32 is remote from the heat sink 36, it can be effectively cooled since the heat it generates is transferred to the heat-exchanging portion 40. Thus, the two heat-generating components 31 and 32 can be cooled uniformly by means of one heat sink 36. As a result, the second heat-generating component 32, i.e., the memory, always remains in a desirable environment. Therefore, the fan device 37 need not be driven frequently. This means that the fan device 37 generates but only a little noise. It follows that the portable computer 1 does not make much noise during its use.

Moreover, the heat-receiving portion 38 need not be extended to contact the second heat-generating component 32 since the second heat pipe 71 transfers heat from the component 32 to the heat-exchanging portion 40 of the heat sink 36. Nor is it necessary to use two fan devices to cool the first and second heat-generating components 31 and 32, respectively, since the cooling air takes the heat from the heat-exchanging portion 40 as it flows through the air passage 50 while the fan device 37 is operating. The cooling unit 35 can therefore be made compact. It follows that the housing 14 need not have a large space for accommodating the cooling unit 35. Hence, the housing 14 can be made, without difficulty, as thin and small as is desired.

The present invention is not limited to the first embodiment described above. FIGS. 8 to 11 show the second embodiment of the invention, which is a portable computer, too. The second embodiment is identical to the first embodiment, except for the structure of the fan device and the structure for radiating heat from the second heat-generating component 32. The components identical to those of the first embodiment are denoted at the same reference numerals as in FIGS. 1 to 7 and will not be described in detail.

Figure 8:
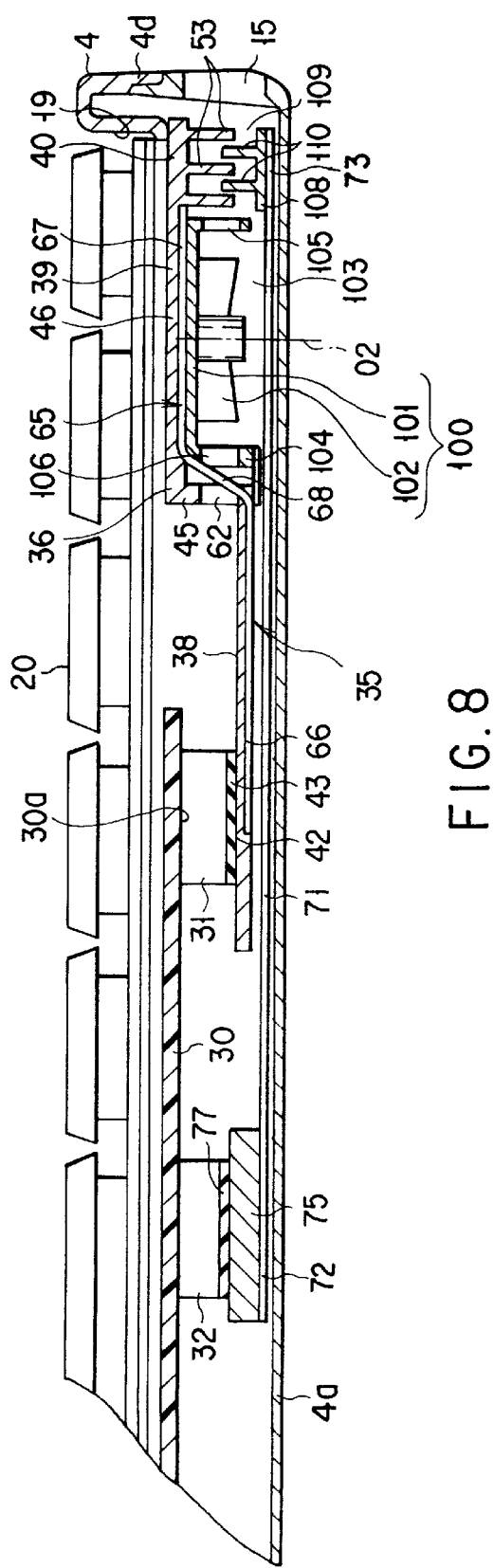
FIG. 8 is a sectional view showing the housing of a portable computer that is the second embodiment of the invention, and the cooling unit provided in the housing.
Figure 9:
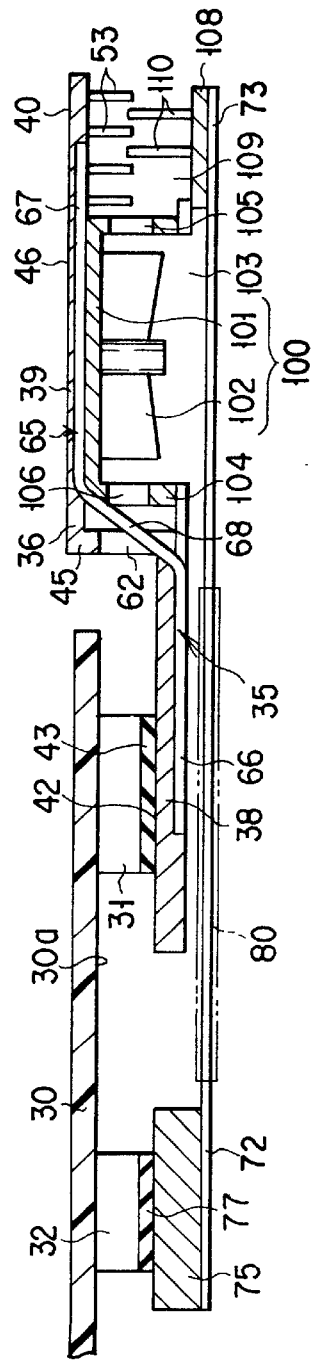
FIG. 9 is a sectional view representing the positional relation between the cooling unit and the MPU mounted on the circuit board incorporated in the second embodiment.
Figure 10:
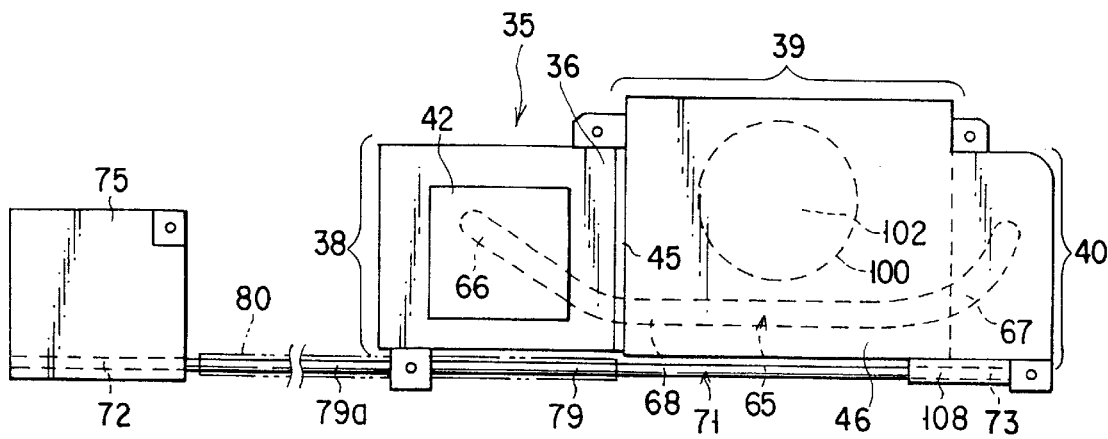
FIG. 10 is a plan view of the cooling unit used in the second embodiment.

As shown in FIG. 8, a fan device 100 has a fan casing 101 and a rotor 102. The fan casing 101, which contains the rotor 102, is secured to the lower surface of the ceiling 46 of the fan-supporting portion 39. The casing 101 is shaped like a flat box and has an inlet port 103. The inlet port 103 opens downwards, opposing the rotor 102. The fan casing 101 has a wall 104 that surrounds the rotor 102. The wall 104 has two air-supplying holes 105 and 106. The first air-supplying hole 105 opens to the heat-exchanging portion 40 of the heat sink 36. The second air-supplying hole 106 opposes the ventilation hole 62 made in the coupling wall 45. The fan device 100 assumes a horizontal position in the housing 14, with the axis 02 of the rotor 102 extending at right angles to the bottom wall 14a of the housing 14.

A heat-radiating block 108 is thermally connected to the second end portion 73 of the second heat pipe 71. The heat-radiating block 108 is shaped like a flat plate and made of metal having high thermal conductivity, such as aluminum alloy. The block 108 is arranged below the heat-exchanging portion 40 of the heat sink 36 and opposes the heat-exchanging portion 40. The heat-exchanging portion 40 and the heat-radiating block 108 constitute an exhaust passage 109. The exhaust passage 109 communicates with the first air-supplying hole 105 of the fan casing 101 and the exhaust port 15 of the housing 14. The block 108 has a number of heat-radiating fins 110 that extend upwards. The fins 110 are located in the exhaust passage 109.

In the second embodiment thus structured, the heat the first heat-generating component 31 generates while operating is conducted from the heat-receiving portion 38 to the fan-supporting portion 39 and heat-exchanging portion 40. The heat therefore diffuses in the entire heat sink 36. The heat is released from the heat sink 36 by virtue of natural convection. Part of the heat transmitted to the heat-receiving portion 38 is effectively transferred to the heat-exchanging portion 40 via the first heat pipe 65.

Figure 11:
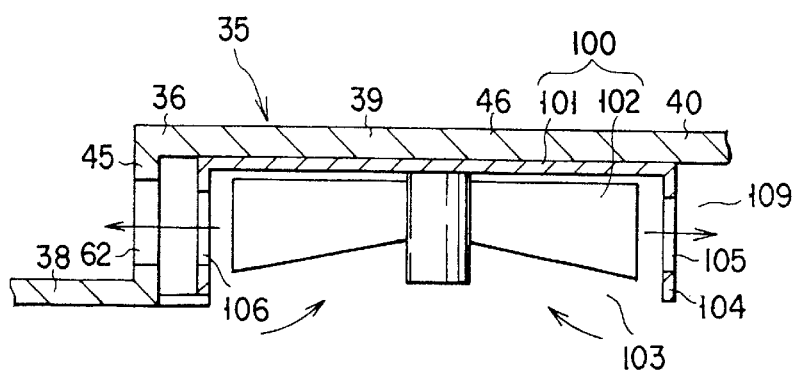
FIG. 11 is a sectional view of the fan device incorporated in the second embodiment.

When the fan device 100 is driven, air is drawn from the interior of the housing 14 into the fan casing 101 through the inlet port 103 of the fan casing 101, as is illustrated by the arrow in FIG. 11. The air serves as cooling air as it flows through the first and second air-supplying holes 105 and 106. Since the first air-supplying hole 105 communicates with the exhaust passage 109, the cooling air is guided from the hole 105 to the exhaust passage 109. The cooling air cools the heat-exchanging portion 40 with high efficiency. As the cooling air flows out of the housing 14 through the exhaust port 15, the heat transferred to the heat-exchanging portion 40 is expelled from the housing 14. Heat is thereby radiated from the first heat-generating component 31 with high efficiency.

As described above, the second air-supplying hole 106 opposes the ventilation hole 62 made in the coupling wall 45. Hence, the cooling air supplied through the hole 106 is supplied through the ventilation hole 62 to the heat-receiving portion 38 and the first heat-generating component 31. The cooling air is directly supplied onto the component 31, promoting the radiation of heat from the component 31. The cooling air supplied through the second air-supplying hole 106 flows inside the housing 14, thus preventing heat from accumulating in the housing 14. This facilitates the radiation of heat from the circuit board 30 that is provided in the housing 14.

As a result, local accumulation of heat hardly occur in the housing 14. In other words, uniform temperature distribution is achieved in the housing 14, providing a good operating environment for the first heat-generating component 31, i.e., the MPU.

Meanwhile, the heat the second heat-generating component 32 has generated is transferred from the heat-receiving plate 75 to the heat-radiating block 108 via the second heat pipe 71. The heat diffuses in the entire heat-radiating block 108 including the heat-radiating fins 110. The block 108 radiates the heat into the housing 14. When the fan device 100 is driven, cooling air flows through the exhaust passage 109, effectively cooling the heat-radiating block 108 and the heat-radiating fins 110. The heat transmitted from the second heat-generating component 32 to the heat-radiating block 108 is expelled from the housing 14 as the cooling air flows out of the housing 14.

The second heat-generating component 32 is located far from the cooling unit 35. Nonetheless, the component 32 can be effectively cooled by virtue of the diffusion of heat in the heat-radiating block 108 and the cooling air supplied from the fan device 100. Hence, the cooling unit 35 can cool both heat-generating components 31 and 32 uniformly. The efficiency of radiating heat from the second heat-generating component 32 can therefore be sufficiently high. The second heat-generating component 32 can remain at appropriate operating temperatures and would not impose a thermal influence on the first heat-generating component 31.

Further, the fan device 100 need not be driven frequently. This means that the fan device 100 generates but only a little noise. It follows that the portable computer does 1 not make much noise during its use.

Since the heat-radiating block 108 merely opposes the heat-exchanging portion 40 of the heat sink 36, not contacting the portion 40 at all, it hardly impose a thermal influence on the heat-exchanging portion 40. The heat-exchanging portion 40 and the heat-radiating block 108 can be cooled with the cooling air, independently of each other. Thus, the efficiency of radiating heat from the first heat-generating component 31 is not adversely affected.

The second heat pipe 71 transfers the heat from the second heat-generating component 32 to a position where the heat-exchanging portion 40 of the heat sink 36 is provided. Therefore, the heat-receiving portion 38 of the heat sink 36 need not extend to contact the second heat-generating component 32. Nor is it necessary to use two fan devices to cool the first and second heat-generating components 31 and 32, respectively, since the cooling air takes the heat generated by the second heat-generating component 32 and transferred to the heat-radiating block 108 as it flows through the air exhaust passage 109 while the fan device 100 is operating. The cooling unit 35 can therefore be made compact. The housing 14 need not have a large space for accommodating the cooling unit 35.

In the second embodiment described above, the cooling air is supplied through the second air-supplying hole 106, directly onto the second heat-generating component 32. The method of supplying cooling air to the component 32 is not limited to this in the present invention. Instead, the cooling air may be supplied to a position where the circuit board 30 is provided.

Each of the heat-generating components 31 and 32 may be replaced by two or more heat-generating components. If this is the case, the heat-receiving portion 38 of the heat sink 36 is thermally connected to the heat-generating components of the first group, and the heat-receiving block is connected to the heat-generating components of the second group.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling unit for cooling a heat-generating component, comprising:

a heat sink including a heat-receiving portion having a heat-receiving surface thermally connected to the heat-generating component and a heat-exchanging portion thermally connected with the heat-receiving portion, the heat receiving portion and the heat-exchanging portion being arranged in a row;

heat-transferring means for transferring, to the heat exchanging portion, heat transmitted from the heat-generating component to the heat-receiving portion; and a fan device having a rotor rotatable about a rotational axis, and provided between the heat-receiving portion and the heat-exchanging portion in such a manner that the rotational axis of the fan device crosses with respect to a direction in which the heat-receiving portion and the heat-exchanging portion are arranged, for supplying cooling air from the heat-receiving portion to the heat-exchanging portion.

2. A cooling unit according to claim 1, further comprising a support portion, supporting the fan device which is interposed between the heat-receiving portion and the heat-exchanging portion.

3. A cooling unit according to claim 2, wherein the support portion has a ventilation hole at a junction with the heat-receiving portion, and the cooling air flows from the heat-receiving portion to the heat-exchanging portion through the ventilation hole.

4. A cooling unit according to claim 1, wherein the heat-transferring means is a heat pipe, which comprises a first end portion thermally connected to the heat-receiving portion and a second end portion thermally connected to the heat-exchanging portion and located above the first end portion.

5. A cooling unit according to claim 4, wherein the fan device has an air passage for guiding the cooling air from the heat-receiving portion to the heat-exchanging portion, and the second end portion of the heat pipe extends into a middle part of the air passage.

6. A cooling unit according to claim 5, wherein the heat pipe has a middle portion which connects the first and second end portions and which is held in a part of the air passage, other than the middle part thereof.

7. A cooling unit for cooling a heat-generating component, comprising:

a heat sink having a heat-receiving portion thermally connected to the heat-generating component and a heat-exchanging portion thermally connected with the heat-receiving portion, said heat-receiving portion and the heat-exchanging portion being arranged in a row so as to define an air passage through the thermal connection between the heat-exchanging portion and the heat-receiving portion;

a heat-transferring device for transferring, to the heat-exchanging portion, heat transmitted from the heat-generating component to the heat-receiving portion; and an air-supply device provided between the heat-receiving portion and the heat-exchanging portion so as to supply air through the air passage and having a first air-supplying port for supplying cooling air to the heat-exchanging portion and a second air-supplying port for supplying cooling air to the heat-receiving portion.

8. A cooling unit for cooling a first heat-generating component and a second heat-generating component each mounted on a circuit board, comprising:

a heat sink having a heat-receiving portion thermally connected to the first heat-generating component and a heat-exchanging portion thermally connected with the heat-receiving portion, said heat-receiving portion and the heat-exchanging portion being arranged in a row;

a heat-receiving part to be thermally connected to the second heat-generating component, at a position different from a position where the heat sink is provided;

first heat-transferring means for transferring, to the heat-exchanging portion, heat transmitted from the first heat-generating component to the heat-receiving portion;

second heat-transferring means for transferring, to the heat-exchanging portion, heat transmitted from the second heat-generating component to the heat-receiving part; and air-supply means provided between the heat-receiving portion and the heat-exchanging portion for supplying cooling air to the heat-exchanging portion.

9. A cooling unit according to claim 8, further comprising a support portion, supporting the air-supply means which is interposed between the heat-receiving portion and the heat-exchanging portion.

10. A cooling unit according to claim 8, wherein the air-supply means is a fan device which has a rotor to be rotated and which is positioned with an axis of the rotor inclined to a vertical line so as to supply cooling air to the heat-exchanging portion.

11. A cooling unit according to claim 8, wherein the first heat-transferring means is a first heat pipe, which comprises a first end portion thermally connected to the heat-receiving portion and a second end portion thermally connected to the heat-exchanging portion, and the second heat-transferring means is a second heat pipe, which comprises a first end portion thermally connected to the heat-receiving part and a second end portion thermally connected to the heat-exchanging portion.

12. A cooling unit according to claim 8, wherein the second heat-transferring means includes a heat pipe thermally connected to the heat-receiving part and a heat-radiating portion for receiving heat from the heat-receiving part through the heat pipe, said heat-radiating portion opposing the heat-exchanging portion, and an air passage is provided between the heat-exchanging portion and the heat-radiating portion, for guiding cooling air from the air-supply means.

13. A cooling unit according to claim 11, wherein the air-supply means has an air passage for guiding cooling air to the heat-exchanging portion, and the second end portion of the first heat pipe extends into a middle part of the air passage.

14. A cooling unit according to claim 13, wherein the first and second heat pipes have each a middle part that connects the first and second end portions, and the middle part of each heat pipe is held at a position deviating from the middle part of the air passage.

15. An electronic apparatus comprising:

a housing having a bottom wall and containing a heat-generating component;

a heat sink having a heat-receiving portion thermally connected to the heat-generating component and a heat-exchanging portion thermally connected with the heat-receiving portion, said heat-receiving portion and the heat-exchanging portion being arranged along the bottom wall in a row;

heat-transferring means for transferring, to the heat-exchanging portion, heat transmitted from the heat-generating component to the heat-receiving portion; and a fan device having a rotor rotatable about a rotational axis, and provided between the heat-receiving portion and the heat-exchanging portion in such a manner that the rotational axis of the fan device crosses with respect to a direction in which the heat-receiving portion and the heat-exchanging portion are arranged, for supplying cooling air from the heat-receiving portion to the heat-exchanging portion.

16. An electronic apparatus according to claim 15, wherein the housing has an exhaust port, and the cooling air supplied by the fan device is guided from the heat-exchanging portion to the exhaust port.

17. An electronic apparatus according to claim 15, wherein the row formed by the heat-receiving portion and the heat-exchanging portion extends along a direction parallel to the bottom wall of the housing.

18. An electronic apparatus comprising:

a housing containing a circuit board, and a first heat-generating component and a second heat-generating component mounted on the circuit board;

a heat sink having a heat-receiving portion thermally connected to the first heat-generating component and a heat-exchanging portion thermally connected with the heat-receiving portion, said heat-receiving portion and the heat-exchanging portion being arranged in a row;

a heat-receiving part to be thermally connected to the second heat-generating component, at a position remote from a position where the heat sink is provided;

first heat-transferring means for transferring, to the heat-exchanging portion, heat transmitted from the first heat-generating component to the heat-receiving portion;

second heat-transferring means for transferring, to the heat-exchanging portion, heat transmitted from the second heat-generating component to the heat-receiving part; and air-supply means provided between the heat-receiving portion and the heat-exchanging portion, for supplying cooling air to the heat-exchanging portion.

19. An electronic apparatus according to claim 18, wherein the housing has a bottom wall, and the heat sink, the heat-receiving part and the air-supple means are arranged so as to define a row extending parallel to the bottom wall.

20. An electronic apparatus according to claim 19, wherein the cooling air flows in the housing, from the heat-receiving portion to the heat-exchanging portion.

21. An electronic apparatus according to claim 18, wherein the housing comprises a bottom wall, and the row formed by the heat-receiving portion and the heat-exchanging portion extends along a direction parallel to the bottom wall of the housing.

22. An electronic apparatus according to claim 18, wherein the housing comprises a bottom wall, the air-supply means is arranged between the heat-receiving portion and the heat-exchanging portion, and the heat-receiving portion and the heat-exchanging portion are arranged so as to define an air passage extending substantially parallel to the bottom wall of the housing.

23. A cooling unit contained in a housing having a bottom wall for cooling a heat-generating component, comprising:

a heat sink having a heat-receiving portion thermally connected to the heat-generating component and a heat-exchanging portion thermally connected with the heat-receiving portion, the heat-receiving portion and the heat-exchanging portion being arranged in a row substantially parallel to the bottom wall;

heat-transferring means for transferring, to the heat-exchanging portion, heat transmitted from the heat-generating component to the heat-receiving portion; and a fan device having a rotor rotatably about a rotational axis, and provided between the heat-receiving portion and the heat-exchanging portion in such a manner that the rotational axis of the fan device crosses with respect to a direction in which the heat-receiving portion and the heat-exchanging portion are arranged, for supplying cooling air from the heat-receiving portion to the heat-exchanging portion.

* * * * *

UNITED STATES PATENT AND TRADEMARK OFFICE
CERTIFICATE OF CORRECTION

PATENT NO. : 6,407,921 B1 Page 1 of 1
DATED : June 18, 2002
INVENTOR(S) : Nakamura et al.

It is certified that error appears in the above-identified patent and that said Letters Patent is hereby corrected as shown below:

Title page,
Item [57], ABSTRACT,
Lines 12-13, change "heat-exchanging portion" to -- heat-exchanging portion. --.

Column 16,
Line 43, change "air-supple means" to -- air-supply means --.

Signed and Sealed this

Eighth Day of April, 2003

JAMES E. ROGAN
*Director of the United States Patent and Trademark Office*